United States Patent [19]

Eichelberger et al.

[11] 4,262,213
[45] Apr. 14, 1981

[54] UNIVERSAL POWER MODULE

[75] Inventors: Charles W. Eichelberger, Schenectady, N.Y.; Michael A. Haase, Euclid, Ohio

[73] Assignee: General Electric Company, Schenectady, N.Y.

[21] Appl. No.: 79,034

[22] Filed: Sep. 26, 1979

[51] Int. Cl.³ .................... H03K 13/24; H02J 13/00
[52] U.S. Cl. .................. 307/40; 307/221 R; 307/234; 323/322; 340/167 A
[58] Field of Search .......... 307/40, 38, 221 R, 221 B, 307/221 C, 221 D, 234, 39, 41, 42, 37, 34; 323/25; 340/347 DD, 167 A

[56] References Cited

U.S. PATENT DOCUMENTS 3,858,116  12/1974  Friedl et al. ............... 340/167 A X
3,996,586  12/1976  Dillion et al. ............... 307/234 X
4,042,830   8/1977  Kellenbenz et al. ........... 307/40

Primary Examiner—L. T. Hix
Assistant Examiner—James L. Dwyer
Attorney, Agent, or Firm—Geoffrey H. Krauss; Marvin Snyder; James C. Davis

[57] ABSTRACT

A universal power supplying module for controlling the application of power to a plurality of loads is disclosed. The universal power module receives a Pulse-Width Modulated (PWM) data signal which includes a plurality of PWM pulses. Each of the PWM pulses is associated with a respective one of the loads and has a width which is indicative of whether or not power is to be applied to its associated load. The universal power module stores binary information in accordance with the pulse width of the PWM pulses and controls the application of power to the loads as a function of the stored information.

16 Claims, 4 Drawing Figures

UNIVERSAL POWER MODULE

BACKGROUND OF THE INVENTION

The present invention is directed towards a power module and, more particularly, to a power module which can control the operation of a plurality of relatively high current loads as a function of relatively low current signals generated by a control circuit such as a microprocessor.

A universal power module of the foregoing type is especially useful in connection with the control of major appliances. Such appliances contain a multiplicity of loads, either resistive (e.g., a heater) or inductive (e.g., motors and solenoids) which require currents well in excess of that which can presently be delivered by most integrated circuits. By way of example, such loads require currents up to 40 amps and voltages up to 240 volts. In contrast, the output of a typical integrated circuit will be in the 100 milliamp, 10 volt range. To solve this problem, most prior art appliances utilize mechanical switches and relays to switch on and off respective loads. While such switching circuits are suitable where loads are manually switched on and off by a user of the appliance or automatically switched off by a timer motor, they do not lend themselves to satisfactory use in modern appliances where the appliance loads are controlled electronically by a microprocessor. In such appliances, the microprocessor is capable of generating only relatively weak signals to activate the power switching device. The primary object of the present invention is to provide a universal power module which can switch on and off selected loads of the appliance (or other electronically controlled apparatus) as a function of the relatively low level signals generated by the microprocessor while at the same time providing relatively high currents (e.g., 40 amps) and voltages (e.g., 240 volts) to the load. It is a further major object of the present invention to perform this function in the most efficient, least expensive manner possible.

BRIEF DESCRIPTION OF THE INVENTION

In order to achieve the foregoing and other objects of the invention, which objects will become apparent from the following description, the universal power module of the present invention controls the application of power to N electrical loads, N being an integer greater than 1, as a function of a pulse-width-modulated (PWM) data signal which includes N PWM pulses, each of which is associated with a respective one of said loads and each of which has a width which is indicative of whether power is to be applied to its associated load. To this end, the universal power module of the present invention comprises:

(A) memory means having N storage locations, each of said storage locations being associated with a respective said load, whereby each of the storage locations is associated with a respective one of the PWM pulses;

(B) input circuit means for storing either a first or a second type of binary signal in each of the storage locations, the particular type of binary signal which is stored in any given storage location being determined by the width of the PWM signal associated therewith, whereby the type of binary signal stored in each of the storage locations indicates whether power is to be applied to the load associated with that storage location; and (C) output circuit means for applying power to those ones of said loads whose associated storage location contains a binary signal which indicates that power is to be applied thereto.

BRIEF DESCRIPTION OF THE DRAWINGS

For the purpose of illustrating the invention, there is shown in the drawings an embodiment which is presently preferred; it being understood, however, that the invention is not limited to the precise arrangements and instrumentalities shown.

DETAILED DESCRIPTION OF THE PREFERRED EMBODIMENT

Figures 1, 2:
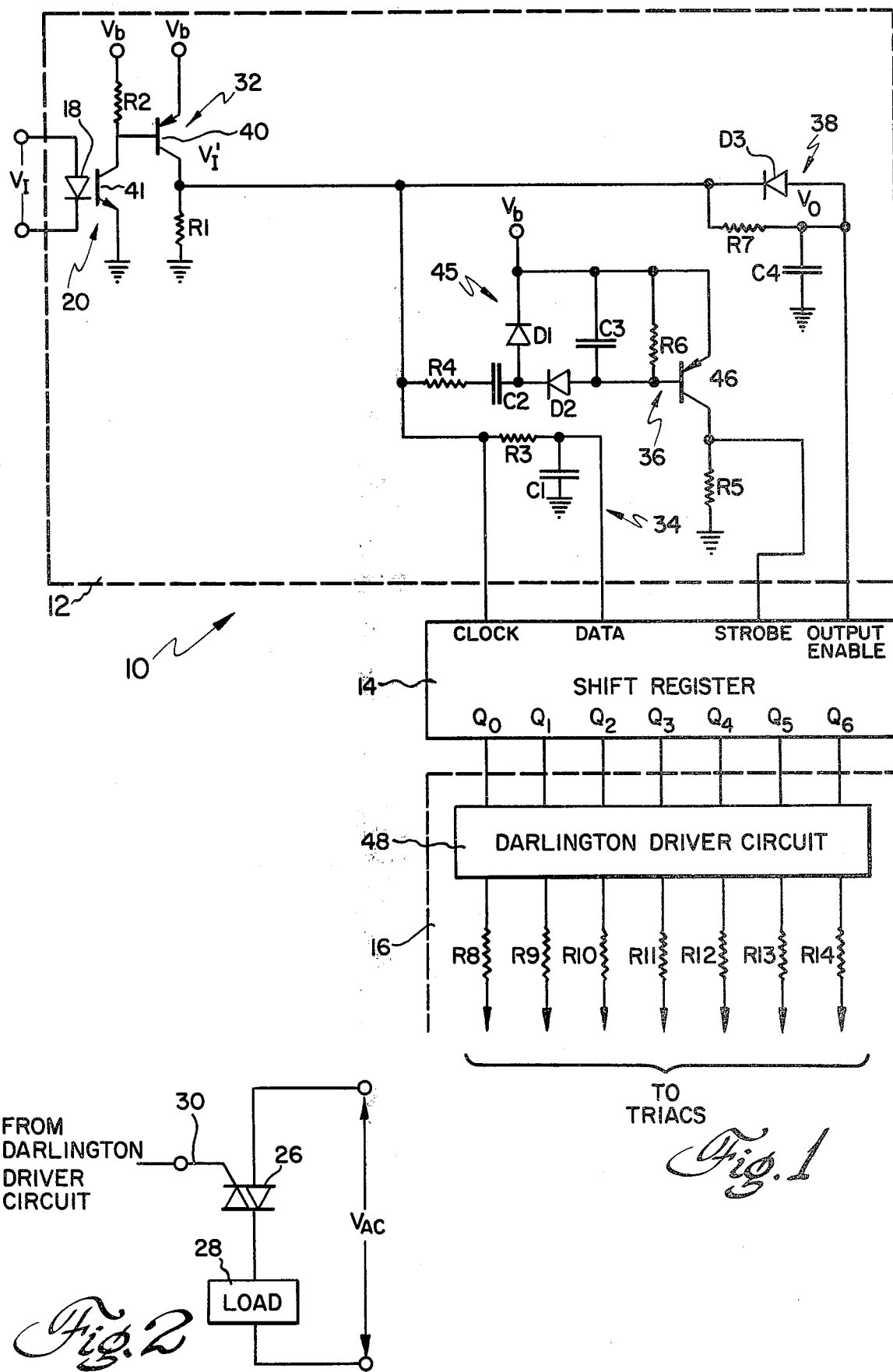
FIG. 1 is a circuit diagram of a power module constructed in accordance with the principles of the present invention.
FIG. 2 is a circuit diagram illustrating a single load circuit which is controlled by the power module of FIG. 1.

Referring now to the drawings, wherein like numerals indicate like elements, there is shown in FIG. 1 a circuit diagram of a universal power module constructed in accordance with the principles of the present invention and designated generally as 10. Power module 10 comprises an input circuit 12, a shift register 14 and an output circuit 16. Input circuit 12 receives an input signal $V_I$ (see FIG. 3B) which is generated by a microcontroller such as a programmed microprocessor and controls the operation of both shift register 14 and output circuit 16 as a function thereof.

Figure 3:
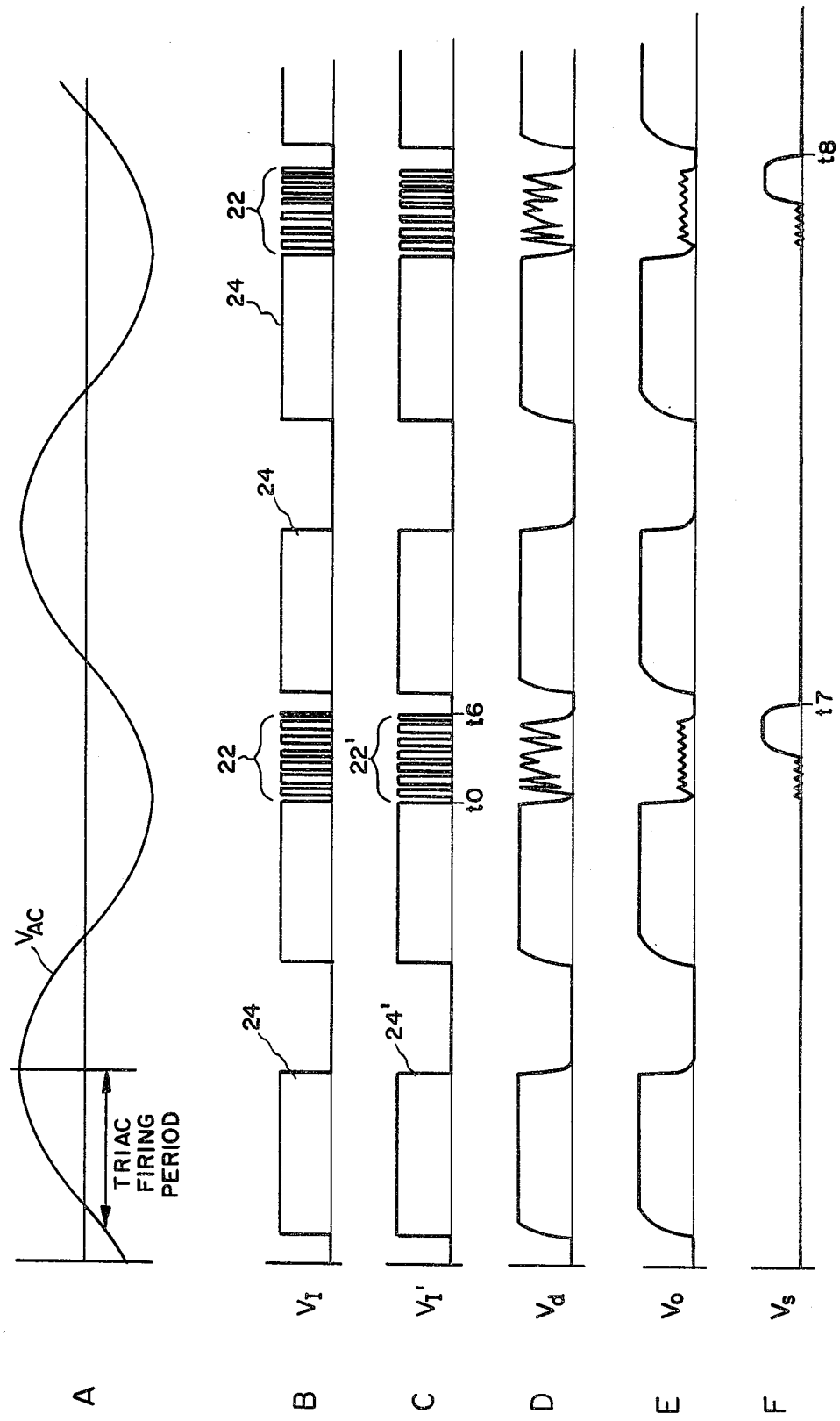
FIG. 3 is a timing diagram illustrating various wave forms of the circuit of FIG. 1 over several cycles of an A.C. waveform being applied to the load of FIG. 2.
Figure 4:
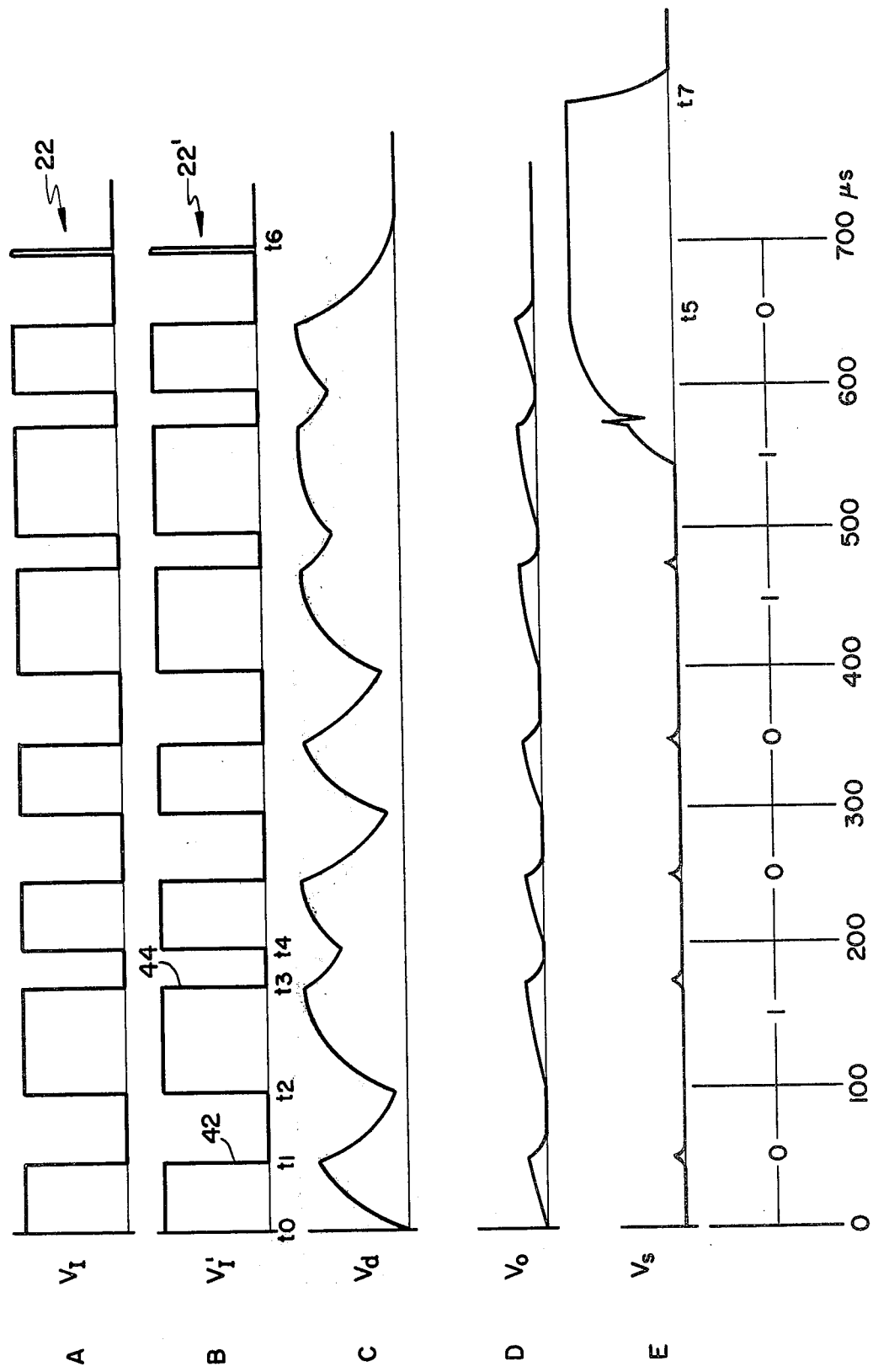
FIG. 4 is a detailed timing diagram illustrating a portion of the timing diagram of FIG. 3.

As shown in FIG. 3B, the input signal $V_I$ includes two types of signals; relatively short data input signals 22 and relatively long triac firing signals 24. As best shown in FIG. 4A, the data input signal 22 comprises a plurality of pulse-width-modulated (PWM) pulses having a relatively high frequency (10,000 cycles per second in the example shown). Each of the PWM pulses of data signal 22 indicates whether an associated one of the loads 28 (one of which is illustrated in FIG. 2) being controlled by the power module 10 is to receive power. In the example illustrated, a relatively short pulse having a duty cycle of 50 percent represents a binary "0" while a relatively long pulse having a duty cycle of 90 percent represents a binary "1". Input circuit 12 examines the length of each of the pulses of the data input signal 22 and causes a binary "1" or a binary "0" to be read into shift register 14 in accordance with the length of the individual pulses of the data input signal 22. In the preferred embodiment, the microcontroller generates one data input signal 22 during each cycle of the voltage waveform $V_{AC}$ of the power supply which is applied to the loads 28. As such, input circuit 12 reads new digital information into shift register 14 during each cycle of the power supply. It should be understood, however, that the data input signals may be generated by the microcontroller and read into shift register 14 at a greater or lesser frequency, as desired.

In the preferred embodiment, the output circuit 16 includes a plurality of triacs 26, one of which is illustrated in FIG. 2. Each triac 26 is coupled in series with the power source $V_{AC}$ and one of the loads 28 being controlled by power module 10. Output circuit 16 enables those loads 28 whose associated triac 26 receives a firing pulse on its gate electrode 30. For peak efficiency, it is preferred that power module 10 enable each triac 26 at the current zero crossing of the load 28 with which it is associated. If a purely resistive load 28 is being controlled, it is possible to fire the triac 26 at the voltage zero crossing of the power source $V_{AC}$. In such a case, the triac firing signal 24 would have a relatively small duration hovering around the zero crossing point of the voltage wave form. In most applications, however, at least some loads 28 will be inductive. Since the current zero crossings of such loads are up to 90° out of phase with their voltage zero crossings, it is preferred that the triac firing signal 24 extend over slightly more than one-quarter cycle of the input wave form $V_{AC}$. In this manner, each triac 26 will be fired at the current zero crossing of its respective load 28 irrespective of whether the load is resistive or inductive in nature.

In addition to controlling the manner in which input is read into shift register 14, input circuit 12 controls the instant at which the information stored in shift register 14 is applied to the output circuit 16 as a function of the input signal $V_I$ to ensure that the triacs 26 are fired at the appropriate current zero crossings. In order to understand the manner in which input circuit 12 performs this function, it is helpful to first examine the operation of shift register 14 and output circuit 16.

In the preferred embodiment, shift register 14 is capable of three operations: converting serial information applied to its data input into parallel information, storing the parallel information read into shift register 14 in a memory section of the shift register, and applying the stored parallel information to the outputs Q0–Qn of the shift register 14.

Shift register 14 includes an input section, a storage section and an output section. The input section includes generally N storage locations (seven in the embodiment illustrated) into which binary data information is serially shifted. Particularly, each time a clock enable signal (a signal transitioning from a binary "0" to a binary "1" level) is applied to the CLOCK input of shift register 14, the binary signal appearing on its DATA input is applied to the first storage position of the input section. Concurrently, the remaining digital signals stored in the input section of shift register 14 are shifted forward by one position as the new data signal is placed into the first storage position.

Once all seven binary signals have been shifted into the input section of shift register 14, this binary information is shifted in parallel into the storage section thereof. The storage section also includes generally N storage locations (seven in the embodiment illustrated). Information is shifted from the input section storage locations to the storage section storage locations when a strobe enable signal (a signal transitioning from a binary "1" to a binary "0" in the example shown) is applied to the STROBE input of shift register 14. The information stored in the storage section of shift register 14 is not affected by new data information read into the input section thereof unless a new strobe enable is applied to the STROBE input of shift register 14. As such, any change in the information stored in the input section of shift register 14 as a result of the generation of the triac firing signals 24 will not affect the information stored in the storage section of shift register 14.

The output section of shift register 14 includes N outputs Q0–Qn (seven outputs, Q0–Q6, in the example shown). The digital signals stored in the N storage locations of the storage section of shift register 14 are applied to the N outputs of the output section of shift register 14 each time an output enable signal (a binary "1" in the example shown) is applied to the OUTPUT ENABLE input of shift register 14. As such, the binary information stored in the storage section of shift register 14 is applied to the output section thereof whenever an output enable signal is applied to the OUTPUT ENABLE input of shift register 14. While any appropriate shift register may be used, one suitable shift register can be obtained from several manufacturers under the general designation 4094.

The operation of shift register 14 is controlled by input circuit 12. Input circuit 12 has four subcircuits; an isolation circuit 32, a data detection circuit 34, a strobe detection circuit 36 and an output enable detection circuit 38. Isolation circuit 32 includes Opto-Isolator 20 and inverting transistor 40 and serves to isolate the microprocessor from the power module 10. As noted above, the input signal $V_I$ is applied across the diode 18 of Opto-Isolator 20 and causes transistor 41 to turn on whenever the input signal $V_I$ is at a binary "1" level. When transistor 41 turns on, it grounds the base of transistor 40 causing the voltage $V_I'$ appearing across resistor R1 to pulse to the biasing voltage level Vb (a binary "1"). Conversely, when the input signal $V_I$ is at the binary "0" level, transistor 41 turns off and the base of transistor 40 receives Vb volts via resistor R2. In this condition, transistor 40 is turned off and the voltage $V_I'$ drops to 0 volts DC (a binary "0"). As shown in FIGS. 3B and 3C, the net effect of the foregoing is to produce an isolated input signal $V_I'$ which is substantially identical in form to the input signal $V_I$.

The isolated input signal $V_I'$ comprises two types of signals; isolated data input signals 22' and isolated triac firing signals 24'. The input signal $V_I'$ generated by isolation circuit 32 is applied to each of the detection circuits 34, 36 and 38.

Data detection circuit 34 includes an RC circuit comprising resistor R3 and capacitor C1 and clocks in an amplitude-modulated binary "0" or an amplitude-modulated binary "1" at the end of each PWM pulse of the data input signal 22. This operation may better be understood with reference to FIGS. 4B and 4C. As shown in FIG. 4C, each time the input signal $V_I'$ pulses to the binary "1" level, capacitor C1 charges to the binary "1" level and then discharges towards 0 volts DC when the input pulse $V_I'$ returns to the binary "0" level. As a result, the magnitude of the voltage across capacitor C1 at the beginning of each PWM pulse is determined by the duty cycle of the last generated PWM pulse. This may best be understood with reference to pulses 42 and 44 of FIG. 4B. At time t0, input signal $V_I'$ pulses to the binary "1" level, causing capacitor C1 to charge to the binary "1" level through resistor R3. At time t1, pulse 42 drops to the binary "0" level and capacitor C1 begins discharging through resistor R3. Since the duty cycle of pulse 42 is approximately 50 percent, capacitor C1 is able to discharge for a substantial time period and is discharged to a binary "0" level at time t2. At time t2, the leading edge of pulse 44 enables the CLOCK input of shift register 14, causing shift register 14 to read a binary "0" into the first storage location of the input section of shift register 14.

Immediately thereafter, capacitor C1 begins recharging to a binary "1" level through resistor R3 and continues charging until time t3. At time t3, pulse 44 pulses to the binary "0" level and capacitor C1 begins discharging through resistor R3. Since the duty cycle of pulse 44 is approximately 90 percent, capacitor C1 discharges only slightly by time t4 and therefore remains at a binary "1" level. At time t4, a binary "1" is read into the first storage location of the input section of shift register 14 and the binary "0" previously stored in that position is shifted to the second storage location thereof. This process continues until time t6 when all seven binary bits of the isolated data input signal 22' (see FIG. 4B) have been read into the input section of shift register 14.

After the entire data input signal 22' has been read into the input section of shift register 14, strobe detection circuit 36 applies a strobe enable pulse to the STROBE input of shift register 14 causing each of the seven bits of information stored in the input section of shift register 14 to be transferred to the seven storage locations of the storage section thereof. Strobe detection circuit 36 includes a voltage doubler circuit 45 and a switching transistor 46. Voltage doubler 45 comprises resistor R4, capacitors C2 and C3, and diodes D1 and D2. This circuit is frequency responsive and pumps charge through capacitor C2 into capacitor C3 so as to create a voltage differential between the base and emitter of switching transistor 44. A small amount of charge is supplied to capacitor C3 during each positive transition of the data input signal 22. The pulse width of each of the PWM pulses of data input signal 22 is, itself, insufficient to create a sufficient charge across capacitor C3 to turn transistor 46 on for a sustained time period. After the generation of several PWM pulses (six in the example shown) of the data input signal 22', the charge across capacitor C3 is finally sufficient to turn transistor 44 on, thereby permitting some current to flow through resistor R5. This current increases until transistor 46 is driven to saturation, at which point the voltage across resistor R5 will be at the biasing voltage level Vb. At time t5, capacitor C3 no longer receives charge from capacitor C2 and begins slowly discharging through resistor R6 and diode D2. The charge across capacitor C3 remains sufficiently high, however, to maintain transistor 46 in saturation until time t7, at which time the transistor rapidly begins turning off. See FIG. 4E. The negative going signal Vs enables the STROBE input of shift register 14, causing the seven binary bits stored in the input section of shift register 14 to be transferred to the storage section of shift register 14. As best seen in FIG. 3F, this information is retained in the storage portion of shift register 14 until time t8, when a new strobe signal Vs is generated. This occurs after a new data input signal 22' has been read into the input section of shift register 14.

As noted above, an enable signal is applied to the gate 30 of each of the triacs 26 whose associated load 28 is to be turned on. More particularly, the enabling signal is applied to the gate 30 during the triac firing period defined by triac firing signals 24 in order to ensure that the triacs 26 will fire at their current zero crossings. In order to ensure this result, input circuit 12 causes the digital information stored in the storage section of shift register 14 to be applied to the output section thereof (and therefore to be applied to output circuit 16) during each triac firing period defined by the triac firing signals 24.

The triac firing signals are detected by output enable detection circuit 38 which includes a capacitor C4, a resistor R7 and a diode D3. Capacitor C4 is charged via resistor R7 whenever the input signal $V_I'$ is at the binary "1" level and is discharged through diode D3 whenever the input signal $V_I'$ is at the binary "0" level. The value of resistor R7 is chosen to be relatively large. As a result, the charging time constant of capacitor C4 is relatively long compared to the charging time constant of capacitors C1 and C3. As such, capacitor C4 charges only slightly during each PWM pulse of the data input signals 22. See FIGS. 4C and 4D. Capacitor C4 is quickly discharged through diode D3 during the intervals between successive PWM pulses such that the voltage Vo across capacitor C4 remains at the binary "0" level throughout the period during which the data input signals 22 are generated.

As best shown in FIGS. 3B and 3C, the duration of each triac firing signal 24' is relatively long compared to the duration of each PWM pulse of the data input signals 22'. As a result, each isolated triac firing signal 24' is at the binary "1" level for a sufficient period of time to permit capacitor C4 to charge through resistor R7 to the binary "1" level. As long as the voltage Vo across capacitor C4 is at the binary "1" level, it will enable the OUTPUT ENABLE input of shift register 14 and cause the digital information stored in the storage section of shift register 14 to be applied in parallel to outputs Q0–Q6 thereof. This information will remain on the outputs of shift register 14 as long as the output enable signal Vo remains at the binary "1" level. As a result, the information stored in the storage section of shift register 14 will appear at the outputs Q0–Q6 of shift register 14 during substantially the entire duration of each triac firing signal 24.

The outputs Q0–Q6 of shift register 14 are applied to respective inputs of Darlington driver circuit 48. Darlington driver circuit 48 includes seven Darlington transistors whose inputs are coupled to respective ones of the outputs Q0–Q6 of shift register 14 and whose outputs are connected to respective ones of resistors R8–R14. Resistors R8–R14 are, in turn, coupled to the gate electrode 30 of respective ones of triacs 26. Each of the Darlington transistors in Darlington driver circuit 48 whose associated output Q0–Q6 is at a binary "1" level applies a binary "1" to its associated resistor R8–R14 and each of the Darlington transistors of Darlington driver circuit 48 whose associated output Q0–Q6 is at a binary "0" level applies a binary "0" to its associated resistor R8–R14. As such, each of the triacs 26 whose associated shift register output Q0–Q6 is at the binary "1" level will be turned on at the zero current crossing point of its associated load 28 while the remaining triacs 26 will be off. In this manner, the binary information stored in the storage section of shift register 14 controls the operation of each of the loads 28.

The present invention may be embodied in other specific forms without departing from the spirit or essential attributes thereof and, accordingly, reference should be made to the appended claims, rather than to the foregoing specification, as indicating the scope of the invention.

What is claimed is:

1. A universal power supply for controlling the application of power to N electrical loads, N being an integer greater than 1, as a function of a PWM data signal, said PWM data signal including N serial PWM pulses, each of said PWM pulses being associated with a respective one of said N loads and having a width which is indicative of whether power is to be applied to its associated load, said power supply comprising:

(A) memory means having N storage locations, each associated with a respective load, for accepting a binary signal as a function of the width of each of said N pulses and responsive to each of N associated clock pulses; said memory means also for storing the binary signal for each associated one of said PWM pulses in an associated one of the storage locations responsive to a strobe signal and providing each of the binary signals at one of N outputs each associated with one of said N storage locations;

(B) an input circuit having means for providing one of said clock pulses responsive to each of said PWM pulses and either a first or a second level of said binary signal to said memory means for storage in each of said storage locations, with the particular level of binary signal which is stored in any given storage location being determined by the width of the PWM signal associated therewith and indicative of whether power is to be applied to the load associated with that storage location;

said input circuit also including means for providing said strobe signal to said memory means only after all of said N PWM pulses have been received; and (C) output circuit means coupled to said memory means outputs for applying power to those ones of said N loads whose associated memory means storage location contains a binary signal of level indicating that power is to be applied to its associated load.

2. A universal power supply according to claim 1, wherein said output circuit means includes N electronic switches, each of said switches being coupled in series with a power source and a respective one of said loads whereby each switch is associated with one of said loads and wherein each of said switches includes a control electrode which determines whether or not said power source is applied to its associated load.

3. A universal power module for controlling the application of A.C. power to N electrical loads, N being an integer greater than 1, as a function of an input signal containing both PWM data signals and load firing signals on a single input line, each of said PWM data signals including N serial PWM pulses, each of said PWM pulses being associated with a respective one of said N loads and having a width which is indicative of whether power is to be applied to its associated load, said power supply comprising:

(A) memory means having N storage locations, each associated with a respective load, for accepting a binary signal as a function of the width of each of said N pulses and responsive to each of N associated clock pulses; said memory means also for storing the binary signal for each associated one of said PWM pulses in an associated one of said storage locations responsive to a strobe signal; said memory means also for providing each of the binary signals at one of N outputs, each associated with one of said N storage locations, responsive to an output enabling signal;

(B) first means for providing one of said clock pulses responsive to each of said PWM pulses and either a first or a second level of said binary signal to said memory means for storage in each of said storage locations with a particular level of binary signal stored in any given storage location being determined by the width of the PWM pulse, in an immediately-previously-received PWM data signal, associated therewith and indicative of whether power is to be applied to the load associated with that storage location; said first means also for providing said strobe signal to said memory means only after all of said N PWM pulses have been received; said first means also for providing said output enabling signal to said memory means only when one of said load firing signals is received on said single input line; and (C) second means coupled to said memory means outputs for applying power to those ones of said N loads whose associated memory means storage location contains a binary signal of level indicating that power is to be applied thereto, said second means applying power to said loads which are to receive power during a time period determined by said load firing signals and the current zero crossings of the loads which are to receive power.

4. A universal power module according to claim 3, wherein said first means causes said binary signals located in said input section of said memory means to be transferred to said storage section responsive to said PWM data signals but not responsive to said load firing signals.

5. A universal power module according to claim 3, wherein said second means includes N electronic switches, each of said switches being associated with a respective said load and being coupled in series with its associated load and an AC power source.

6. A universal power source according to claim 5, wherein each of said switches includes a control electrode and wherein said second means applies enabling signals to the control electrodes of those loads whose associated storage location contains a binary signal level indicating that power is to be applied to that load.

7. A universal power module according to claim 6, wherein said second means applies said enabling signals, to said electrodes of said switches whose associated loads are to receive power, only during intervals determined by said load firing signals.

8. A universal power supply according to claim 1, wherein the clock pulse and binary signal providing means includes a resistance-capacitance circuit receiving each of said PWM pulses at an input thereof and providing said binary signal level at an output thereof responsive to the width of the pulse at said input, each of said clock pulses being provided to said memory means responsive to an edge of each pulse at the input of said resistance-capacitance circuit.

9. A universal power supply according to claim 8, wherein said input circuit strobe signal providing means includes a voltage-doubler having an input receiving said serial PWM pulses and an output, at which a predetermined level is provided only after receipt of all of said N PWM pulses; and a switching device having an input connected to the output of said voltage-doubler and an output at which said strobe signal appears responsive to the output of said voltage-doubler reaching said predetermined level.

10. A universal power supply according to claim 1, wherein said input circuit further includes means for isolating a source of said PWM pulses from both said clock pulse and binary signal providing means and said strobe signal providing means.

11. A universal power supply according to claim 10, wherein said isolation means includes an isolation device having an input receiving the PWM pulses from said source thereof and having an output at which appears an inverted representation of the pulses applied to said isolation device input; and an active inverter circuit having an input receiving the output signals of said isolation device and an output at which appears a signal substantially identical to the PWM pulse signal at said isolation device input.

12. A universal power module according to claim 3, wherein said first means includes a data detection circuit including a resistance-capacitance circuit receiving each of said PWM pulses at an input thereof and providing said binary signal level at an output thereof responsive to the width of the pulse at said input, each of said clock pulses being provided to said memory means responsive to an edge of each pulse at the input of said resistance-capcitance circuit.

13. A universal power supply according to claim 8, wherein said first means includes a strobe detection circuit including a voltage-doubler having an input receiving said serial PWM pulses and an output at which a predetermined level is provided only after receipt of all of said N PWM pulses; and a switching device having an input connected to the output of said voltage-doubler and an output at which said strobe signal appears responsive to the output of said voltage-doubler reaching said predetermined level.

14. A universal power module according to claim 3, wherein said first means include an output enable detection circuit including a resistance-capacitance-diode circuit receiving each of said PWM pulses at an input thereof and having an output at which is provided said output enabling signal as a signal charging with a selected time constant to said first binary level, when present at said input, and substantially immediately discharging to said second binary level when said second binary level is present at said input.

15. A universal power module according to claim 12, 13 or 14 wherein said first means further includes means for isolating a source of said PWM pulses from at least one of said data, strobe and output enable detection circuits.

16. A universal power module as set forth in claim 15, wherein said isolating means include an isolation device having an input receiving the PWM pulses from said source thereof and having an output at which appear an inverted representation of the pulses applied to said isolation device input; and an active inverter circuit having an input receiving the output signals of said isolation device and an output at which appears a signal substantially identical to the PWM pulse signal at said isolation device input.

* * * * *